United States Patent
Li et al.

(10) Patent No.: US 11,115,039 B2
(45) Date of Patent: Sep. 7, 2021

(54) VOLTAGE-TO-TIME CONVERTER AND METHOD FOR REDUCING PARASITIC CAPACITANCE AND POWER SUPPLY INFLUENCES

(71) Applicant: No. 24 RESEARCH INSTITUTE OF CHINA ELECTRONICS TECHNOLOGY GROUP CORPORATION, Chongqing (CN)

(72) Inventors: Ting Li, Chongqing (CN); Zhengbo Huang, Chongqing (CN); Yong Zhang, Chongqing (CN); Yabo Ni, Chongqing (CN); Jian'an Wang, Chongqing (CN); Dongbing Fu, Chongqing (CN)

(73) Assignee: No. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/057,702

(22) PCT Filed: May 13, 2019

(86) PCT No.: PCT/CN2019/086601
§ 371 (c)(1),
(2) Date: Nov. 23, 2020

(87) PCT Pub. No.: WO2019/223562
PCT Pub. Date: Nov. 28, 2019

(65) Prior Publication Data
US 2021/0203344 A1 Jul. 1, 2021

(30) Foreign Application Priority Data
May 23, 2018 (CN) .......................... 201810499890.3

(51) Int. Cl.
*G11C 27/02* (2006.01)
*H03K 5/00* (2006.01)
(Continued)

(52) U.S. Cl.
CPC .... *H03M 1/1245* (2013.01); *G01R 19/16538* (2013.01); *H03M 1/129* (2013.01); *H03M 1/54* (2013.01)

(58) Field of Classification Search
CPC ..... G11C 27/026; G11C 27/024; G11C 27/02; G01R 13/342; H03K 17/063; H03M 1/00;
(Continued)

(56) References Cited

U.S. PATENT DOCUMENTS 5,341,050 A * 8/1994 Mellissinos .......... G06G 7/1865
327/355
7,595,678 B2 * 9/2009 Cao ........................ H03F 3/005
327/337

(Continued)

FOREIGN PATENT DOCUMENTS

CN 102255615 A 11/2011
CN 103078644 A 5/2013
(Continued)

*Primary Examiner* — Quan Tra

(57) ABSTRACT

The present disclosure provides a voltage-to-time converter and method for reducing parasitic capacitance and power supply influences. The voltage-to-time converter includes: a main sampling network, a compensation sampling network, a discharge network and an over-threshold detection unit. The influence of a traditional VTC parasitic capacitance on a VTC output swing amplitude is reduced by using the compensation sampling network. A sampling common-mode level of the compensation sampling network is compensated, such that the influence of the low-frequency disturbance of a power supply voltage on a threshold of a traditional VTC threshold detection circuit is reduced. The output swing amplitude of the voltage-to-time converter of
(Continued)

the present disclosure can reduce the influence of a parasitic capacitance. A voltage common-mode level of a VTC input end is related to a power supply voltage, which reduces a conversion error caused by the influence of the power supply voltage on a threshold.

9 Claims, 2 Drawing Sheets

(51) Int. Cl.
  *H03K 17/00* (2006.01)
  *H03M 1/12* (2006.01)
  *G01R 19/165* (2006.01)
  *H03M 1/54* (2006.01)
(58) Field of Classification Search
  CPC . H03M 2201/4135; H03M 2201/4262; H03M 2201/4233; H03M 2201/02
  USPC ............................... 327/91–96; 341/122–124
  See application file for complete search history.

(56) References Cited

U.S. PATENT DOCUMENTS

| | | | |
|---|---|---|---|
| 9,413,373 B1* | 8/2016 | Ishii | ................... H03F 3/45183 |
| 2016/0359463 A1* | 12/2016 | Kurose | ............... H03M 1/1245 |

FOREIGN PATENT DOCUMENTS

| | | |
|---|---|---|
| CN | 203206101 U | 9/2013 |
| CN | 203608182 U | 5/2014 |
| CN | 108736893 A | 11/2018 |
| EP | 1401104 A2 | 3/2004 |

* cited by examiner

VOLTAGE-TO-TIME CONVERTER AND METHOD FOR REDUCING PARASITIC CAPACITANCE AND POWER SUPPLY INFLUENCES

CROSS REFERENCES TO RELATED APPLICATIONS

This is a Sect. 371 National Stage application of a PCT International Application No. PCT/CN2019/086601, filed on May 13, 2019, which claims priority of a Chinese Patent Applications No. 2018104998903, filed on May 23, 2018, the content of which is hereby incorporated by reference in its entirety for all purposes.

TECHNICAL FIELD

The present disclosure relates to the field of electronics, and in particular, to a voltage-to-time converter and conversion method for reducing the influences of parasitic capacitance and power supply.

BACKGROUND

Voltage-to-Time Converter (VTC) samples the input voltage by a fixed clock pulse width, then discharges at another clock phase by using a constant current source, and then detects whether the discharge voltage reaches the threshold by using an over-threshold detection unit. If the discharge voltage exceeds the threshold, the output level of the over-threshold detection unit is inverted, such that the input voltage signal is converted into a clock delay proportional to the input voltage amplitude, the input voltage is converted into the clock delay.

When the traditional VTC is converted from the sampling phase to the conversion phase, due to the presence of parasitic capacitances at the input end of MOSFET switch and the over-threshold detection unit, when the sampling capacitor is time-division multiplexed by other modules, the size of the sampling capacitor is strictly limited and the value is small, and the input voltage amplitude is small, the influence of parasitic capacitance would seriously limit the differential voltage swing amplitude at the input end of the over-threshold detection unit, thereby limiting the output swing amplitude of VTC. In addition, the threshold of the over-threshold detection unit of the traditional VTC is often related to the power supply voltage. The threshold level of the over-threshold detection unit would be affected by the voltage disturbances, which will reduce the VTC conversion performance, severely limit the application of VTC in the small swing amplitude input voltage, and worsen the converter performance.

SUMMARY

The present disclosure provides a voltage-to-time converter and method for reducing the parasitic capacitance and power supply influences, to solve the above-mentioned problems.

The voltage-to-time converter of the present disclosure for reducing the influence of parasitic capacitance and power supply includes:

a main sampling network, to sample a main input signal and a main reference level;

a compensation sampling network, to sample a compensation input signal and a compensation reference level;

The main sampling network includes a main sampling capacitor, and a main sampling common-mode level for sampling and converting the difference between the input voltage and the reference voltage; the compensation sampling network includes a compensation sampling capacitor and a compensation sampling common-mode level, the compensation sampling common-mode level samples and converts the difference between the input voltage and the reference level, and compensates the input voltage;

a discharge network, to discharge the main sampling capacitor and the compensation sampling capacitor;

an over-threshold detection unit, to detect whether the output level of the discharge network exceeds the threshold and convert the input level into time.

Further, in the sampling stage, the main sampling network and the compensation sampling network simultaneously sample the input voltage; in the conversion stage, the compensation sampling network is connected to the main sampling network, and simultaneously performs voltage-time domain conversion with the main sampling network.

Further, during the conversion phase, the relationship between the voltage of the input end of the over-threshold detection unit and the input voltage is:

$$V_{TCD} = \frac{V_{CMSP}(C_S + C_P) + V_{CC}C_C}{C_C + C_S + C_P} + (V_{REF} - V_{IN})\frac{C_S + C_C}{C_C + C_S + C_P}$$

$V_{TCD}$ is the voltage of the input end of the over-threshold detection unit, $V_{CMSP}$ is the main sampling common-mode level, $V_{IN}$ is the input voltage, $V_{REF}$ is the reference voltage, $V_{CC}$ is the compensation sampling common-mode level, $C_S$ is the main sampling capacitance, $C_C$ is the compensation sampling capacitance, $C_P$ is the parasitic capacitance at the input end of the over-threshold detector.

Further, the relationship between the compensation sampling common-mode level $V_{CC}$ and the power supply voltage $V_{DD}$, and the relationship between the voltage threshold VTH of the over-threshold detection unit and the power supply voltage $V_{DD}$ are:

$$\begin{cases} V_{CC} = \frac{C_C + C_S + C_P}{C_C}V_{TH} = \frac{C_C + C_S + C_P}{C_C}KV_{DD} \\ V_{TH} = KV_{DD} \end{cases}$$

K is the proportionality coefficient between the voltage threshold of the over-threshold detection unit and the power supply voltage, $V_{TH}$ is the voltage threshold of the over-threshold detection unit, and $V_{DD}$ is the power supply voltage.

Further, the main sampling network further includes a main input sampling switch, a main reference level sampling switch and a main common-mode sampling switch; the compensation sampling network further includes a compensation input sampling switch, a compensation reference level sampling switch and a compensation common-mode sampling switch; the discharge network includes a first discharge switch, a second discharge switch, and a constant current source;

the two ends of the main input sampling switch are respectively connected with the input voltage and one end of the main sampling capacitor, the two ends of the main reference level sampling switch are respectively connected with the reference voltage and one end of the main sampling capacitor, and the other end of the main sampling capacitor is connected with the main sampling common-mode level through the main common-mode sampling switch;

the two ends of the compensation input sampling switch are respectively connected with the input voltage and one end of the compensation sampling capacitor, the two ends of the compensation reference level sampling switch are respectively connected with the reference voltage and one end of the compensation sampling capacitor, and the other end of the compensation sampling capacitor is connected with the compensation sampling common-mode level through the compensation common-mode sampling switch;

one end of the first discharge switch is connected with the other end of the compensation sampling capacitor; the other end of the first discharge switch is connected with one end of the second discharge switch and the input end of the over-threshold detection unit; the other end of the second discharge switch is grounded via the constant current source; the input end of the over-threshold detection unit is grounded via the parasitic capacitance at the input end of the over-threshold detection unit.

Further, the switches and capacitors of the main sampling network have structures same to that of the switches and capacitors of the compensation sampling network; size parameters of corresponding devices between the switches and capacitors of the main sampling network and the switches and capacitors of the compensation sampling network are proportional, and the RC time constant of the main sampling network is the same as that of the compensation sampling network.

The present disclosure further provides a voltage-to-time conversion method for reducing the influence of parasitic capacitance and power supply, including:

providing a main sampling network to sample a main input signal and a main reference level, and providing a compensation sampling network to sample a compensation input signal and a compensation reference level;

the main sampling network includes a main sampling capacitor and a main sampling common-mode level, the main sampling common-mode level samples and converts the difference between the input voltage and the reference voltage; the compensation sampling network includes a compensation sampling capacitor and a compensation sampling common-mode level, the compensation sampling common-mode level samples and converts the difference between the input voltage and the reference level, and compensates the input voltage;

in the sampling stage, sampling the input voltage simultaneously by the main sampling network and the compensation sampling network;

in the conversion phase, merging the compensation sampling network with the main sampling network, accessing to the conversion network to detect whether the output level of the discharge network exceeds the threshold, and converting the input level into time.

Further, during the conversion phase, the relationship between the voltage of the input end of over-threshold detection unit and the input voltage is:

$$V_{TCD} = \frac{V_{CMSP}(C_S + C_P) + V_{CC}C_C}{C_C + C_S + C_P} + (V_{REF} - V_{IN})\frac{C_S + C_C}{C_C + C_S + C_P}$$

$V_{TCD}$ is the voltage of the input end of the over-threshold detection unit, $V_{CMSP}$ is the main sampling common-mode level, $V_{IN}$ is the input voltage, $V_{REF}$ is the reference voltage, $V_{CC}$ is the compensation sampling common-mode level, $C_S$ is the main sampling capacitance, $C_C$ is the compensation sampling capacitance, $C_P$ is the parasitic capacitance at the input end of the over-threshold detector.

Further, the relationship between the compensation sampling common-mode level $V_{CC}$ and the power supply voltage $V_{DD}$, and the relationship between the voltage threshold $V_{TH}$ of the over-threshold detection unit and the power supply voltage $V_{DD}$ are:

$$\begin{cases} V_{CC} = \dfrac{C_C + C_S + C_P}{C_C} V_{TH} = \dfrac{C_C + C_S + C_P}{C_C} K V_{DD} \\ V_{TH} = K V_{DD} \end{cases}$$

K is the proportionality coefficient between the voltage threshold of the over-threshold detection unit and the power supply voltage, $V_{TH}$ is the voltage threshold of the over-threshold detection unit, and $V_{DD}$ is the power supply voltage.

Beneficial effects of the present disclosure: the voltage-to-time converter and conversion method for reducing influences of parasitic capacitance and power supply reduces the influence of a traditional VTC parasitic capacitance on a VTC output swing amplitude by using the compensation sampling network. A compensation design is made for a sampling common-mode level of the compensation sampling network, such that the influence of the low-frequency disturbance of a power supply voltage on a threshold of a traditional VTC threshold detection circuit is reduced. The output swing amplitude of the voltage-to-time converter of the present disclosure can reduce the influence of parasitic capacitance. A voltage common-mode level of a VTC input end is related to a power supply voltage, which reduces a conversion error caused by the influence of the power supply voltage on a threshold, such that a threshold voltage is less influenced by the power supply voltage, thereby improving the conversion accuracy and performance.

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during the actual implementation thereof may be freely changed, and the component layout configuration thereof may be more complicated.

In this Embodiment, the voltage-to-time converter for reducing the influence of parasitic capacitance and power supply includes:

a main sampling network, to sample a main input signal and a main reference level;

a compensation sampling network, to sample a compensation input signal and a compensation reference level;

the main sampling network includes a main sampling capacitor, and a main sampling common-mode level for sampling and converting the difference between the input voltage and the reference voltage; the compensation sampling network includes a compensation sampling capacitor and a compensation sampling common-mode level, the compensation sampling common-mode level samples and converts the difference between the input voltage and the reference level, and compensates the input voltage;

a discharge network, to discharge the main sampling capacitor and the compensation sampling capacitor;

an over-threshold detection unit, to detect whether the output level of the discharge network exceeds the threshold and convert the input level into time.

Figure 1:
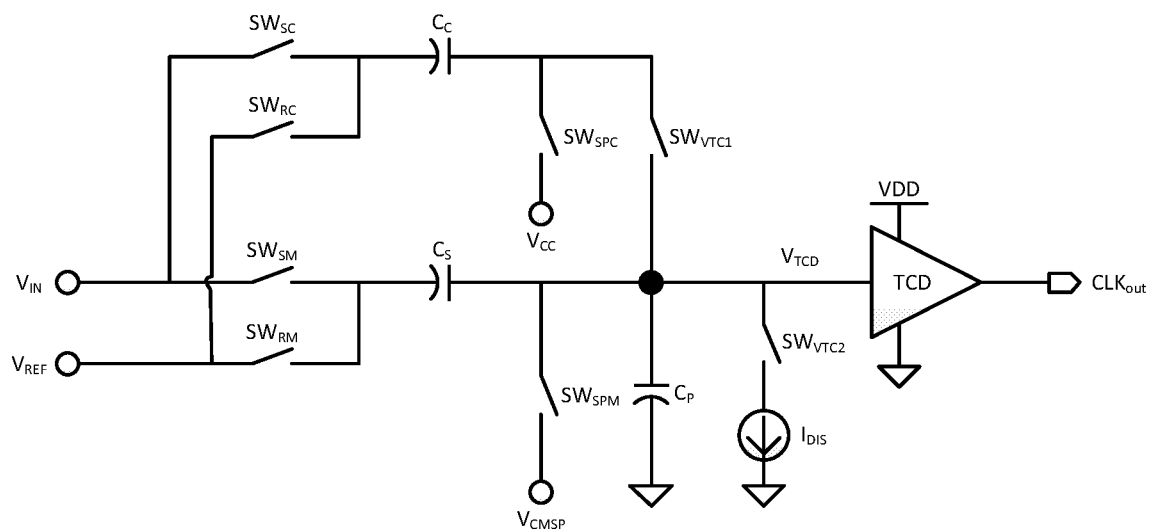
FIG. 1 is a schematic principle diagram of the present disclosure.

As shown in FIG. 1, in this Embodiment, the main sampling network mainly includes a main input sampling switch $SW_{SM}$, a main reference level sampling switch $SW_{RM}$, a main common-mode sampling switch $SW_{SPM}$, and a main sampling capacitor $C_S$. The main sampling common-mode level is $V_{CMSP}$, which is mainly used to sample and convert the difference between the input signal $V_{IN}$ and the reference voltage $V_{REF}$. The compensation sampling network mainly includes a compensation input sampling switch $SW_{SC}$, a compensation reference level sampling switch $SW_{RC}$, a compensation common-mode sampling switch $SW_{SPC}$, and a compensation sampling capacitor $C_C$. The compensation sampling common-mode level is $V_{CC}$, to sample and convert the difference between the input signal $V_{IN}$ and the reference level $V_{REF}$, and compensate the influence of the power supply voltage on the threshold through $V_{CC}$. The discharge network mainly includes discharge switch $SW_{VTC1}$, discharge switch $SW_{VTC2}$ and current source $I_{DIS}$. The discharge network is mainly used to discharge the input signals sampled by the main sampling capacitor $C_S$ and the compensation sampling capacitor $C_C$. The current source $I_{DIS}$ is a constant current source, the value of the current source $I_{DIS}$ is determined by the discharge clock pulse width, TCD threshold level, TCD input end common-mode and the swing amplitude of the input signal $V_{REF}-V_{IN}$. In this embodiment, the over-threshold detection unit is an over-threshold detector TCD, to detect whether the output level of the discharge network exceeds the threshold. If the threshold is exceeded, the output of the TCD is inverted. Specifically, the TCD detects the discharge at the input end. When the level at the input end is lower than the threshold level, the output of the TCD is inverted, to complete the conversion of input level to time. In this embodiment, by using a compensation sampling network and a compensating voltage, the influence of power supply voltage fluctuation on parasitic capacitance and the TCD threshold of the traditional VTC are eliminated respectively.

In this embodiment, the compensation sampling network and the main sampling network sample the input signal simultaneously at the sampling stage, accesses the conversion network at the conversion stage, and performs voltage-to-time conversion simultaneously with the main sampling network. At this time, the relationship between the voltage of the input end of over-threshold detection detector TCD and the input voltage turns into:

$$V_{TCD} = \frac{V_{CMSP}(C_S + C_P) + V_{CC}C_C}{C_C + C_S + C_P} + (V_{REF} - V_{IN})\frac{C_S + C_C}{C_C + C_S + C_P} \quad \text{(Formula 1)}$$

$V_{TCD}$ is the voltage of the input end of the over-threshold detection unit, $V_{CMSP}$ is the main sampling common-mode level, $V_{IN}$ is the input voltage, $V_{REF}$ is the reference voltage, $V_{CC}$ is the compensation sampling common-mode level, $C_S$ is the main sampling capacitance, $C_C$ is the compensation sampling capacitance, $C_P$ is the parasitic capacitance at the input end of the over-threshold detection unit. Assuming that the sampling common-mode level $V_{CC}$ of the compensation sampling network is equal to 0 V, the larger the compensation capacitance, the less the VTC output swing amplitude is influenced by the parasitic capacitance.

A compensation design is made for the sampling common-mode level $V_{CC}$ of the sampling network, such that the relationship between $V_{CC}$ and the power supply voltage is:

$$V_{CC} = \frac{C_C + C_S + C_P}{C_C} KV_{DD} \quad \text{(Formula 2)}$$

The voltage common-mode level $V_{TCD}$ of the VTC input end is related to the power supply voltage $V_{DD}$, thereby reducing the conversion error caused by the influence of the power supply voltage $V_{DD}$ on the threshold.

Figure 2:
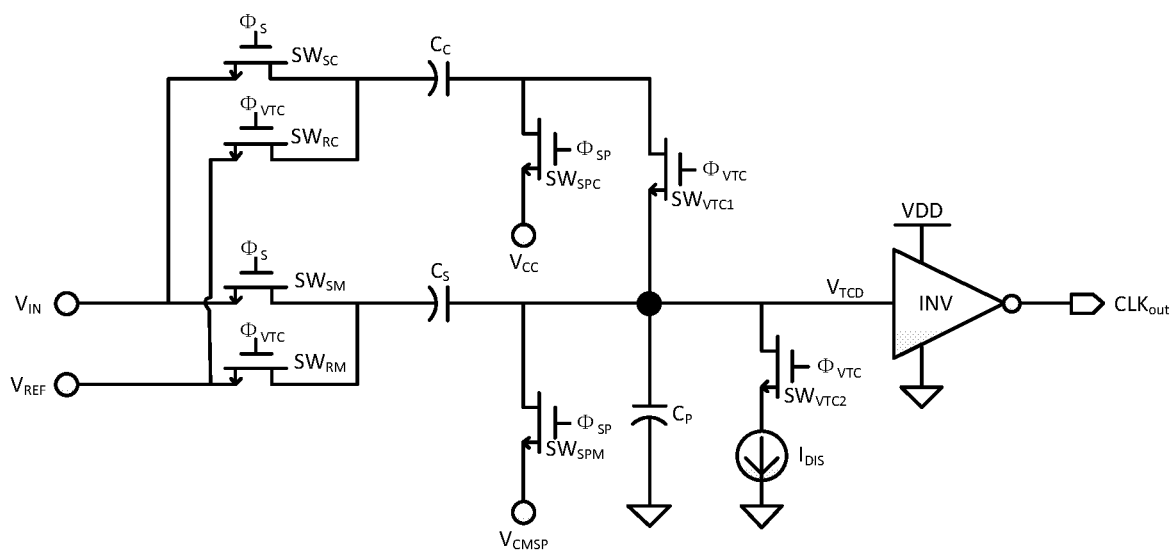
FIG. 2 is a circuit schematic diagram of a voltage-to-time converter for reducing the influences of parasitic capacitance and power supply in an Embodiment of the present disclosure.

As shown in FIG. 2, the two ends of the main input sampling switch $SW_{SC}$ are respectively connected with the input voltage $V_{IN}$ and one end of the main sampling capacitor $C_S$. The two ends of the main reference level sampling switch $SW_{RM}$ are respectively connected with the reference voltage $V_{REF}$ and one end of the main sampling capacitor $C_S$. The other end of the main sampling capacitor $C_S$ is connected with the main sampling common-mode level $V_{CMSP}$ through the main common-mode sampling switch $SW_{SPM}$. The two ends of the compensation input sampling switch $SW_{SC}$ are respectively connected with the input voltage $V_{IN}$ and one end of the compensation sampling capacitor $C_C$. The two ends of the compensation reference level sampling switch $SW_{RC}$ are respectively connected with the reference voltage $V_{REF}$ and one end of the compensation sampling capacitor $C_C$. The other end of the compensation sampling capacitor $C_C$ is connected with the compensation sampling common-mode level $V_{CC}$ through the compensation common-mode sampling switch $SW_{SPC}$.

One end of the first discharge switch $SW_{VTC1}$ is connected with the other end of the compensation sampling capacitor $C_C$. The other end of the first discharge switch $SW_{VTC1}$ is connected with one end of the second discharge switch $SW_{VTC2}$ and the input end of the over-threshold detection unit. The other end of the second discharge switch $SW_{VTC2}$ is grounded via the constant current source $I_{DIS}$. One end of the parasitic capacitance $C_P$ at the input end of the over-threshold detection unit is connected with the input end of the over-threshold detection unit, and the other end of the parasitic capacitance $C_P$ is grounded.

In this embodiment, the size of the main sampling capacitor is limited by other design specifications of the circuit. When the value is small, the larger the value of the compensation capacitor, the smaller the influence on the parasitic capacitance. In addition, the switches and capacitors of the main sampling network have structures same as that of the switches and capacitors of the compensation sampling network. Size parameters of corresponding devices between the switches and capacitors of the main sampling network and the switches and capacitors of the compensation sampling network are proportional, to ensure that the RC time constant of the main sampling network is the same as that of the compensation sampling network. The compensation sampling common-mode level $V_{CC}$ may be designed in any level generation manner, as long as the voltage relationship in the above (Formula 2) is satisfied.

Correspondingly, this embodiment also provides a voltage-to-time conversion method for reducing the influence of parasitic capacitance and power supply, including:

providing a main sampling network to sample a main input signal and a main reference level, and providing a compensation sampling network to sample a compensation input signal and a compensation reference level;

the main sampling network includes a main sampling capacitor and a main sampling common-mode level, and the main sampling common-mode level samples and converts the difference between the input voltage and the reference voltage; the compensation sampling network includes a compensation sampling capacitor and a compensation sampling common-mode level, and the compensation sampling common-mode level samples and converts the difference between the input voltage and the reference level, and compensates the input voltage;

in the sampling stage, sampling the input voltage simultaneously by the main sampling network and the compensation sampling network;

in the conversion stage, connecting the compensation sampling network to a conversion network, performing the voltage-time conversion simultaneously with the main sampling network, detecting, by the over-threshold detection unit, whether the output level of the discharge network exceeds the threshold, and converting the input level into time.

Figure 3:
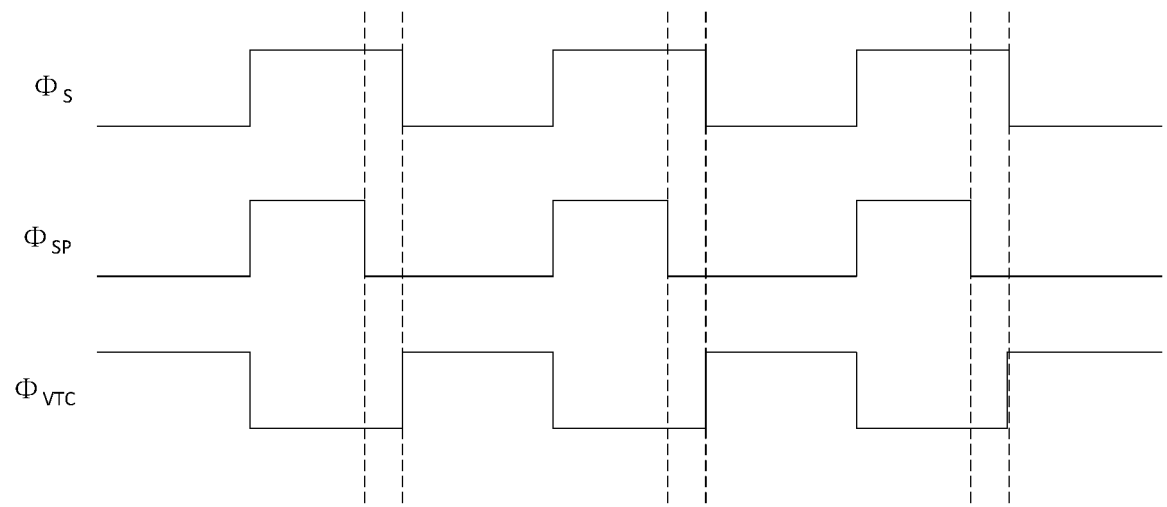
FIG. 3 is a timing relationship diagram of a voltage-to-time conversion method for reducing the influences of parasitic capacitance and power supply in an Embodiment of the present disclosure.

As shown in FIG. 3, in this embodiment, when the sampling clocks $\Phi_S$ and $\Phi_{SP}$ are at high levels, as shown in the circuit diagram of FIG. 2, the switches $SW_{SM}$, $SW_{SC}$, $SW_{SPM}$ and $SW_{SPC}$ are turned on, the remaining switches $SW_{RM}$, $SW_{RC}$, $SW_{VTC1}$ and $SW_{VTC2}$ are disconnected, the VTC enters the sampling stage, and the main sampling capacitor $C_S$ and the compensation sampling capacitor $C_C$ track and maintain the input signal $V_{IN}$. When the falling edge of the lower plate sampling clock $\Phi_{SP}$ arrives, the switches $SW_{SPM}$ and $SW_{SPC}$ are disconnected, and the main sampling capacitor $C_S$ and the compensation sampling capacitor $C_C$ maintain the input signal $V_{IN}$.

When the conversion clock $\Phi_{VTC}$ is at high level, the switches $SW_{RM}$, $SW_{RC}$, $SW_{VTC1}$ and $SW_{VTC2}$ are turned on, the remaining $SW_{SM}$, $SW_{SC}$, $SW_{SPM}$ and $SW_{SPC}$ are disconnected, and VTC enters the conversion phase.

The initial value of TCD input voltage is:

$$V_{TCD} = \frac{V_{CMSP}(C_S + C_P) + V_{CC}C_C}{C_C + C_S + C_P} + (V_{REF} - V_{IN})\frac{C_S + C_C}{C_C + C_S + C_P}$$

The compensation sampling common-mode level $V_{CC}$ is related to the threshold voltage of the over-threshold detector TCD:

$$V_{CC} = \frac{C_C + C_S + C_P}{C_C}V_{TH} = \frac{C_C + C_S + C_P}{C_C}KV_{DD}$$

K is the proportionality coefficient between the voltage threshold $V_{TH}$ of the over-threshold detector TCD and the power supply voltage $V_{DD}$, $V_{TH}$ represents the TCD inversion threshold. The compensation sampling level $V_{CC}$ may be designed in any level generation manner, as long as the voltage relationship in the above formula is satisfied. Substituting the $V_{CC}$ expression into the $V_{TCD}$ expression to get:

$$V_{TCD} = \frac{V_{CMSP}(C_S + C_P)}{C_C + C_S + C_P} + V_{TH} + (V_{REF} - V_{IN})\frac{C_S + C_C}{C_C + C_S + C_P}$$

The discharge relationship of TCD input voltage is:

$$V_{TCD\_DIS} = V_{TCD} - \frac{I_{DIS} \cdot t}{C_C + C_S + C_P}$$

The over-threshold detector detects whether the discharge level $V_{TCD\_DIS}$ is lower than the threshold $V_{TH}$, that is, the conversion output time corresponding to the input signal $V_{IN}$ is:

$$t = \frac{(V_{TCD\_DIS} - V_{TH})(C_C + C_S + C_P)}{I_{DIS}}$$

By substituting the $V_{TCD}$ expression into the above formula, the influence of the threshold voltage $V_{TH}$ on the output time can be eliminated, that is, the influence of $V_{TH}$ on the overall performance of the system caused by the power supply voltage fluctuations is eliminated.

When VTC discharges to time to, $V_{TCD\_DISS} - V_{TH} < 0$, then the output of the over-threshold detector TCD is inverted, and the output time to corresponding to $V_{REF} - V_{IN}$ is recorded. VTC conversion ends.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A voltage-to-time converter for reducing influences of parasitic capacitance and power supply, comprising:

a main sampling network, to sample a main input signal and a main reference level;

a compensation sampling network, to sample a compensation input signal and a compensation reference level;

the main sampling network comprises a main sampling capacitor and a main sampling common-mode level, the main sampling common-mode level samples and converts a difference between an input voltage and a reference voltage; the compensation sampling network comprises a compensation sampling capacitor and a compensation sampling common-mode level, the compensation sampling common-mode level samples and converts the difference between the input voltage and a reference level, and compensates the input voltage;

a discharge network, to discharge the main sampling capacitor and the compensation sampling capacitor;

an over-threshold detection unit, to detect whether the output level of the discharge network exceeds the threshold and convert an input level into time.

2. The voltage-to-time converter for reducing influences of parasitic capacitance and power supply according to claim 1, wherein in a sampling stage, the main sampling network and the compensation sampling network simultaneously sample the input voltage; in a conversion stage, the compensation sampling network is connected to the main sampling network, and performs voltage-time domain conversion simultaneously with the main sampling network.

3. The voltage-to-time converter for reducing influences of parasitic capacitance and power supply according to claim 2, wherein in the conversion phase, a relationship between a voltage of an input end of the over-threshold detection unit and the input voltage is:

$$V_{TCD} = \frac{C_{CMSP}(C_S + C_P) + V_{CC}C_C}{C_C + C_S + C_P} + (V_{REF} - V_{IN})\frac{C_S + C_C}{C_C + C_S + C_P}$$

$V_{TCD}$ is the voltage of the input end of the over-threshold detection unit, $V_{CMSP}$ is a main sampling common-mode level, $V_{IN}$ is the input voltage, $V_{REF}$ is a reference voltage, $V_{CC}$ is a compensation sampling common-mode level, $C_S$ is a main sampling capacitance, $C_C$ is a compensation sampling capacitance, CP is a parasitic capacitance at the input end of the over-threshold detection unit.

4. A voltage-to-time converter for reducing influences of parasitic capacitance and power supply according to claim 3, wherein a relationship between the compensation sampling common-mode level $V_{CC}$ and a power supply voltage $V_{DD}$, and a relationship between a voltage threshold $V_{TH}$ of the over-threshold detection unit and the power supply voltage $V_{DD}$ are:

$$\begin{cases} V_{CC} = \frac{C_C + C_S + C_P}{C_C}V_{TH} = \frac{C_C + C_S + C_P}{C_C}KV_{DD} \\ V_{TH} = KV_{DD} \end{cases}$$

K is a proportionality coefficient between the voltage threshold of the over-threshold detection unit and the power supply voltage, $V_{TH}$ is the voltage threshold of the over-threshold detection unit, and $V_{DD}$ is the power supply voltage.

5. A voltage-to-time converter for reducing influences of parasitic capacitance and power supply according to claim 2, wherein the main sampling network further comprises a main input sampling switch, a main reference level sampling switch and a main common-mode sampling switch; the compensation sampling network further comprises a compensation input sampling switch, a compensation reference level sampling switch and a compensation common-mode sampling switch; the discharge network comprises a first discharge switch, a second discharge switch, and a constant current source;

two ends of the main input sampling switch are respectively connected with the input voltage and one end of the main sampling capacitor, two ends of the main reference level sampling switch are respectively connected with the reference voltage and one end of the main sampling capacitor, and the other end of the main sampling capacitor is connected with the main sampling common-mode level through the main common-mode sampling switch;

two ends of the compensation input sampling switch are respectively connected with the input voltage and one end of the compensation sampling capacitor, two ends of the compensation reference level sampling switch are respectively connected with the reference voltage and one end of the compensation sampling capacitor, and the other end of the compensation sampling capacitor is connected with the compensation sampling common-mode level through the compensation common-mode sampling switch;

one end of the first discharge switch is connected with the other end of the compensation sampling capacitor; the other end of the first discharge switch is connected with one end of the second discharge switch and the input end of the over-threshold detection unit; the other end of the second discharge switch is grounded via the constant current source; the input end of the over-threshold detection unit is grounded via the parasitic capacitance at the input end of the over-threshold detection unit.

6. A voltage-to-time converter for reducing influences of parasitic capacitance and power supply according to claim 5, wherein the switches and capacitors of the main sampling network have structures same as that of the switches and capacitors of the compensation sampling network; size parameters of corresponding devices between the switches and capacitors of the main sampling network and the switches and capacitors of the compensation sampling network are proportional, and an RC time constant of the main sampling network is the same as that of the compensation sampling network.

7. A voltage-to-time conversion method for reducing influences of parasitic capacitance and power supply, comprising:

providing a main sampling network to sample a main input signal and a main reference level, and providing a compensation sampling network to sample a compensation input signal and a compensation reference level;

the main sampling network comprises a main sampling capacitor and a main sampling common-mode level, the main sampling common-mode level samples and converts a difference between an input voltage and a reference voltage; the compensation sampling network comprises a compensation sampling capacitor and a compensation sampling common-mode level, the compensation sampling common-mode level samples and converts a difference between the input voltage and a reference level, and compensates the input voltage;

in a sampling stage, sampling the input voltage simultaneously by the main sampling network and the compensation sampling network;

in a conversion phase, merging the compensation sampling network with the main sampling network, accessing to a conversion network to detect whether an output level of a discharge network exceeds a threshold, and converting an input level into time.

8. The voltage-to-time conversion method for reducing influences of parasitic capacitance and power supply according to claim 7, wherein in the conversion phase, a relationship between a voltage of an input end of an over-threshold detection unit and the input voltage is:

$$V_{TCD} = \frac{V_{CMSP}(C_S + C_P) + V_{CC}C_C}{C_C + C_S + C_P} + (V_{REF} - V_{IN})\frac{C_S + C_C}{C_C + C_S + C_P}$$

$V_{TCD}$ is the voltage of the input end of the over-threshold detection unit, $V_{CMSP}$ is a main sampling common-mode level, $V_{IN}$ is the input voltage, $V_{REF}$ is a reference voltage, $V_{CC}$ is a compensation sampling common-mode level, $C_S$ is a main sampling capacitance, $C_C$ is a compensation sampling capacitance, $C_P$ is a parasitic capacitance at the input end of the over-threshold detector.

9. The voltage-to-time conversion method for reducing influences of parasitic capacitance and power supply according to claim 7, wherein a relationship between the compensation sampling common-mode level $V_{CC}$ and a power supply voltage $V_{DD}$, and a relationship between a voltage threshold $V_{TH}$ of the over-threshold detection unit and the power supply voltage $V_{DD}$ are:

$$\begin{cases} V_{CC} = \frac{C_C + C_S + C_P}{C_C}V_{TH} = \frac{C_C + C_S + C_P}{C_C}KV_{DD} \\ V_{TH} = KV_{DD} \end{cases}$$

K is the proportionality coefficient between the voltage threshold of the over-threshold detection unit and the power supply voltage, $V_{TH}$ is the voltage threshold of the over-threshold detection unit, and $V_{DD}$ is the power supply voltage.

* * * * *